(12) United States Patent
D'Evelyn et al.

(10) Patent No.: US 6,887,144 B2
(45) Date of Patent: May 3, 2005

(54) SURFACE IMPURITY-ENRICHED DIAMOND AND METHOD OF MAKING

(75) Inventors: Mark Philip D'Evelyn, Niskayuna, NY (US); Dong-Sil Park, Schenectady, NY (US); Thomas Richard Anthony, Schenectady, NY (US); Clifford Lawrence Spiro, Willoughby Hills, OH (US); Yue Meng, Columbus, OH (US); Christopher Allen Long, Westerville, OH (US)

(73) Assignee: Diamond Innovations, Inc., Worthington, OH (US)

( * ) Notice: Subject to any disclaimer, the term of this patent is extended or adjusted under 35 U.S.C. 154(b) by 427 days.

(21) Appl. No.: 09/783,441

(22) Filed: Feb. 14, 2001

(65) Prior Publication Data

US 2001/0043903 A1 Nov. 22, 2001

Related U.S. Application Data

(63) Continuation of application No. 09/225,914, filed on Jan. 5, 1999, now abandoned, which is a continuation-in-part of application No. 08/748,246, filed on Nov. 12, 1996, now abandoned.

(51) Int. Cl.$^7$ ................................................ C01B 31/06
(52) U.S. Cl. ...................... 451/462; 423/275; 423/446; 117/929; 428/408
(58) Field of Search ................................ 423/446, 265, 423/266, 275; 117/929; 428/367, 408; 257/655; 427/531; 451/462

(56) References Cited

U.S. PATENT DOCUMENTS

| | | | |
|---|---|---|---|
| 3,268,457 A | | 8/1966 | Giardini et al. |
| 4,184,079 A | | 1/1980 | Hudson et al. |
| 4,836,881 A | | 6/1989 | Satoh et al. |
| 5,078,551 A | * | 1/1992 | Oomen ........................ 407/119 |
| 5,523,071 A | | 6/1996 | Jackson et al. |
| 5,609,926 A | | 3/1997 | Prins |

FOREIGN PATENT DOCUMENTS

EP        668377 A1    8/1995

OTHER PUBLICATIONS

"Diffusion of Boron, Lithium, Oxygen, Hydrogen, and Nitrogen in Type IIa Natural Diamond", by Popovici et al., Journal of Applied Physics, vol. 77, No. 10 (1995).

"An Investigation of the Distribution of Boron Atoms in the Aggregate Crystals of Diamond Containing Boron", Wenhui et al., vol. 193–140 B+C No. 1–3, pp. 654–657, May 1986, netherlands.

"Diffusion of Impurities Under bias in CVD Diamond Films", G. Popovici et al., Diamond, SiC and Nitride Wide Bandgap Semiconductors, Symposium, San Francisco, CA, USA, Apr.–Aug. 1994, Pittsburgh, PA, pp. 601–606.

"The Effect of Carbon and Nitrogen Implantation on the Abrasion Resistance of Type IIa (110) Diamond", Anderson et al., 8th International Conference on Ion Beam Modification of Materials, Heidelberg, Germany, Sep. 7–11, 1992, vol. 880–81, pt. 2, pp. 1451–1455.

"Stresses Generated by Impurities in Diamond", TR Anthony, Diamond and Related Materials, pp. 1346–1352 (Dec. 1995).

European Search Report.

* cited by examiner

*Primary Examiner*—Stuart Hendrickson
(74) *Attorney, Agent, or Firm*—Pepper Hamilton LLP

(57) ABSTRACT

An element-doped diamond crystal is disclosed herein. The crystal includes at least one dopant element which has a greater concentration toward or near an outermost surface of the crystal than in the center of the crystal. The concentration of the dopant element is at a local minimum at least about 5 micrometers below the surface. The concentration-profile of the dopant element for these diamond crystals causes an expansion of the diamond lattice, thereby generating tangential compressive stresses at the surface of the diamond crystal. These stresses beneficially increase the compressive fracture strength of the diamond.

24 Claims, 8 Drawing Sheets

SURFACE IMPURITY-ENRICHED DIAMOND AND METHOD OF MAKING

This is a continuation of abandoned application Ser. No. 09/225,914, filed Jan. 5, 1999.

This patent application is a continuation-in-part of application Ser. No. 08/748,246, filed on Nov. 12, 1996 now abandoned.

TECHNICAL FIELD

This invention is related to a diamond composition and article, grown at high temperature and pressure with improved compressive fracture strength (CFS). More particularly, this invention relates to the inhomogeneous incorporation of selected elements toward and/or near the outer surface of the diamond crystal to increase its fracture strength and performance. The invention also relates to methods for making diamond crystals which are surface-enriched with elements that increase their compressive fracture strength.

BACKGROUND OF THE INVENTION

Diamond crystals are typically used for the production of diamond tools, such as grinding wheels, dressing or truing tools for grinding wheels, and saw blades.

To function effectively in the above-mentioned applications, diamond crystals having the highest strength, including compressive fracture strength, are desirable. The compressive fracture strength is a key specification for diamond crystals, and is often correlated with the diamond's performance in such applications. Crystal fracture strength, as measured by Roll Crusher, correlates with performance of diamond in these applications, such as stone cutting.

The compressive fracture strength may be measured by compressively fracturing a population of diamond grains both before and after treatment. The Roll Crusher method utilizes an apparatus having a pair of hard counter-rotating rollers adapted with a means to measure the compressive force applied by the rollers to grains passing between the rollers at the moment of grain fracture. The motion of one of the rollers is measured by a suitable transducer, such as a linear voltage differential transformer, to generate an electric signal proportional in voltage to the deflection of the roller, and hence, proportional to the compressive force on the diamond grain.

Diamond is a brittle solid and fails by fracture. Its elastic constant (Young's modulus of diamond) is high: $1.143 \times 10^{12}$ pascals. The ductile-brittle transition temperature for diamond is about 1150° C. The above applications use diamond in the brittle fracture region extending from room temperature to about 1000 ° C.

Impurity atoms dissolved in the diamond crystal, such as boron, nitrogen, and hydrogen, can generate stresses because of the large lattice dilations that they cause. For example, dissolved nitrogen, boron, and hydrogen atoms expand the diamond lattice around them by 40%, 33.7%, and 31%, respectively. If the distribution of dissolved nitrogen, boron, or hydrogen is uniform in a diamond crystal, the lattice just expands uniformly, and no long-range stresses develop. However, if the distribution of nitrogen, boron, or hydrogen is not uniform, inhomogeneous strains will occur in the diamond. These uneven strains will generate large long-range stresses.

Presently, the impurity concentration in synthetic diamond crystals decreases with increasing radius within the diamond crystal. There are several reason for this. For instance, in the High Pressure High Temperature (HPHT) process used to synthesize diamond crystals, the concentration of nitrogen in the melt decreases with time because the growing diamond takes up nitrogen from the melt. ("Melt" refers to the molten, metallic catalyst/solvent through which carbon is transported from the graphite feedstock to the growing diamond crystals at high pressure and high temperature.). Another reason is that the growth rate of the diamond crystal is decreasing with increasing radius, and the impurity incorporation decreases with decreasing growth rate. Further, the impurity concentration in the diamond crystal may depend on the growth sector. By "growth sector" is meant the crystallographic direction in which growth took place (or is taking place), and the region(s) in the crystal in which growth occurred in the same direction.

This decreasing impurity concentration with increasing radius (i.e., negative concentration gradient) causes tangential tensile stresses on the surface of the diamond. Since diamond is a brittle solid, its compressive fracture strength is reduced by these tangential tensile stresses.

As technology advances, the next generation of diamond will require higher strength. Thus, there is a need for a diamond crystal with increased compressive fracture strength. There is also a need for methods to manufacture these diamond crystals.

SUMMARY OF THE INVENTION

In accordance with these needs, this invention comprises an element-doped diamond crystal, comprising at least one dopant element which has a greater concentration toward or near an outermost surface of the crystal than in the center of the crystal, wherein the concentration of the dopant element is at a local minimum at least about 5 micrometers below the surface. Examples of the dopant elements are boron, nitrogen, hydrogen, lithium, nickel, cobalt, sodium, potassium, aluminum, phosphorous, oxygen, and any mixture thereof.

Usually, the dopant-element concentration within an outermost section of about 3–50 micrometers of the diamond crystal is in an amount of about 40 to about 10,000 parts per million. Moreover, in some embodiments, the concentration of the dopant element is at a local maximum at a distance less than about 5 micrometers from the surface of the crystal.

The concentration-profile of the dopant element for diamond crystals of this invention causes an expansion of the diamond lattice, thereby generating tangential compressive stresses at the surface of the diamond crystal. The generation of tangential compressive stresses increases the compressive fracture strength of the diamond, as compared to a diamond crystal in which the diamond lattice is not substantially expanded. The increase in compressive fracture strength is preferably at least about 2%, and more preferably, at least about 4%. The increase in compressive fracture strength is especially useful for synthetic diamond applications and articles of manufacture, such as diamond grit, which is used in cutting or grinding tools.

Methods for making diamond crystals having a relatively high compressive fracture strength, along with the impurity concentration-profile described herein, are also disclosed.

DETAILED DESCRIPTION OF THE INVENTION

Figure 1:
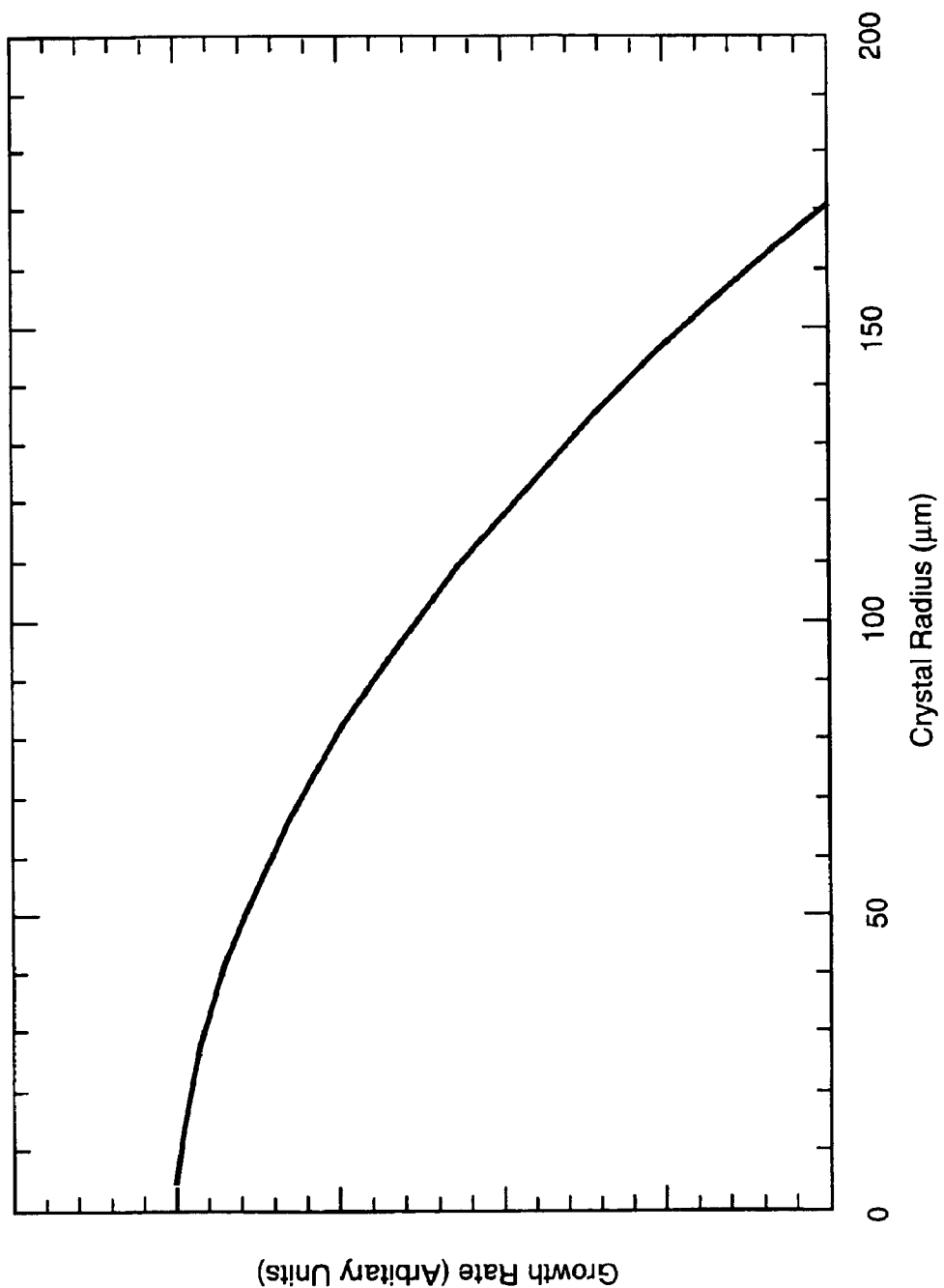
FIG. 1 is a plot of the growth rate versus the diamond crystal radius for the prior art.
Figure 2:
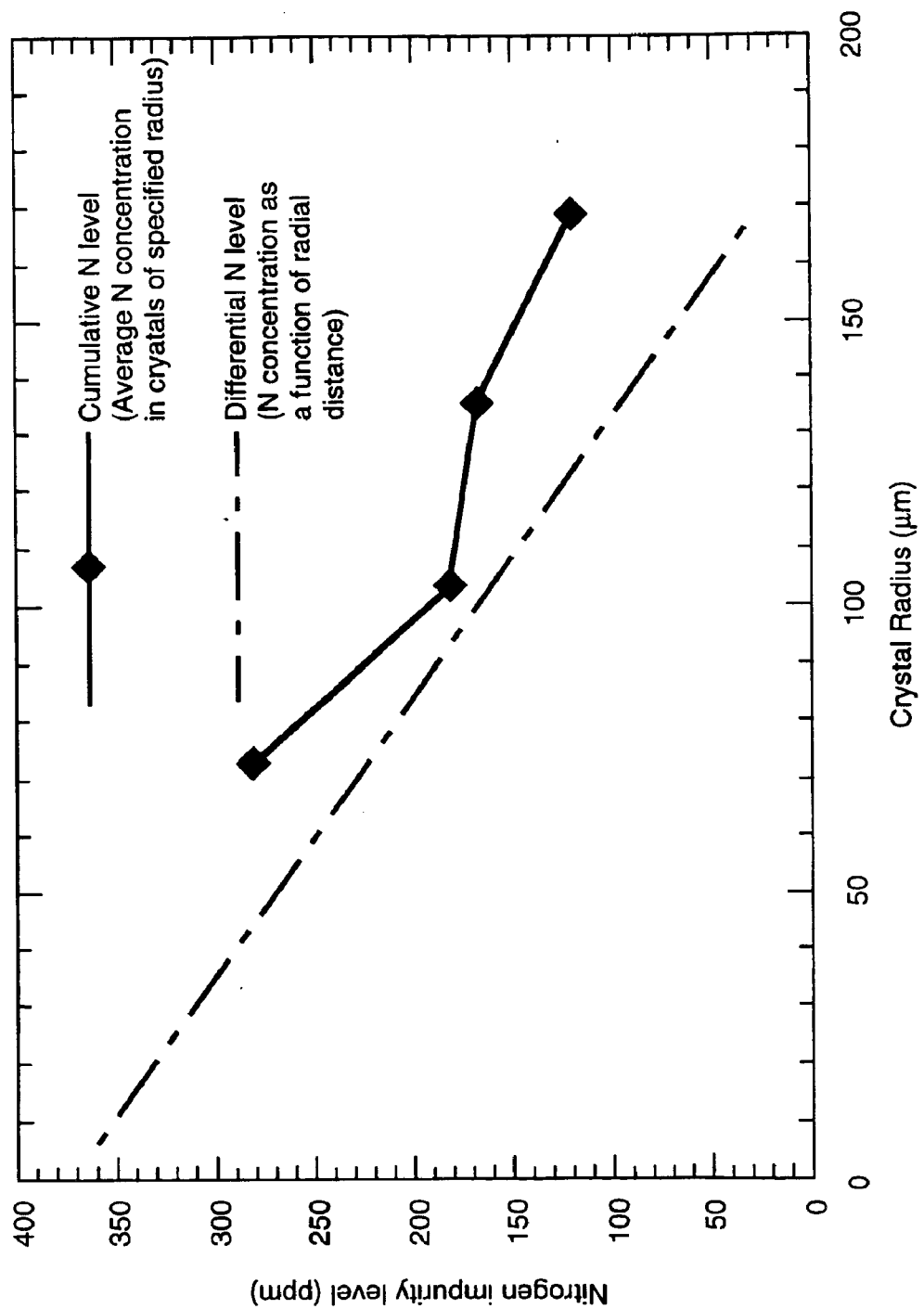
FIG. 2 also shows the prior art, depicting a plot of nitrogen impurity level in parts per million (ppm), versus the diamond crystal radius.

The present invention is based in part on the discovery that a positive radial gradient (i.e., increasing concentration with increasing radius) of an impurity element within a diamond lattice produces tangential compressive stresses at the diamond surface. These stresses strengthen the diamond in the same manner as tempered glass. (This type of spatial distribution of impurities causes a greater expansion of the diamond lattice near the surface of the crystal, than near the center of the crystal, which in turn produces the tangential compressive stresses at the crystal surface).

Examples of the impurity or doping element include boron, nitrogen, hydrogen, lithium, nickel, cobalt, sodium, potassium, aluminum, phosphorous, and oxygen. Also, interstitials and vacancies in the crystal may be considered impurities, including carbon interstitials. Boron, hydrogen, and nitrogen readily incorporate into the diamond during growth. In this invention, nitrogen can have a local concentration of about 0–1000 parts per million (ppm); boron can have a local concentration of about 0–10,000 ppm; and hydrogen can have a local concentration of about 0–1000 ppm. Moreover, there can be a mixture of boron, nitrogen and hydrogen with a concentration of about 0–10,000 parts per million.

Many of the diamond crystals of the present invention would not be considered semiconductors, e.g., p-type semiconductors. For example, when the dopant element is boron, aluminum, or a mixture thereof, the concentration of nitrogen which is dissolved in diamond crystals of this invention may exceed the total concentration of the dopant elements—often by at least about 5 ppm. In such an instance, the diamond crystal generally cannot function as a semiconductor. As another example, when the dopant element is nitrogen, hydrogen, nickel, cobalt, oxygen, or a mixture thereof, the diamond crystal also cannot generally function as a semiconductor.

Natural isotopic abundance diamond is comprised of two carbon isotopes, namely 98.9% $^{12}C$ carbon and 1.1% $^{13}C$ carbon. More than 1.1% of carbon isotope $^{13}C$ can be considered an impurity in natural isotopic abundance diamond. The $^{13}C$ isotope causes a contraction of the diamond lattice. Therefore, a negative concentration gradient of $^{13}C$ isotope is produced in a diamond crystal, and compressive tangential stresses will be developed at the surface of the diamond, causing the diamond to be strengthened.

The diamond crystal utilized in the invention is a synthetic diamond usually made by a High Pressure high Temperature process wherein pressures greater than about 45 kilobar are combined with temperatures exceeding about 1200° C. in the carbon P-T region where diamond is the thermodynamically preferred phase. A variety of diamond crystals can be produced. The chemical vapor deposition (CVD) method of making diamonds can also be used in this invention.

It is also contemplated that the process of the present invention is suitable for use with a variety of starting diamond crystals (also referred to as "grains"). The commercially available diamond abrasive grains are available at various grades of strength and toughness. Variations in growth rate during manufacture is one factor that may be utilized to control the properties of the diamond abrasive grain. A perfect diamond crystal is likely to have more regular cleavage and wear. Crystal faults, twinning, and the like may occur and lead to variations in the diamond crystalline properties.

The starting diamond crystals preferably have uncoated surfaces. It is intended that the process of the present invention be utilized to increase the compressive fracture strength of the diamond prior to subsequent attachment to a tool. By way of example, a diamond crystal of this invention is at least nominally a single crystal, but also may have one or more twin planes present. It is a three dimensional (3-D) faceted diamond crystal. The diameter of the diamond crystal is up to and including about 2 centimeters (2 cm). The diamond crystal has an impurity concentration (i.e., the concentration of the dopant element) that usually increases with increasing radius, leading to a compressive tangential stress at the surface of the crystal. In one embodiment of this invention, the impurities are at a local maximum at or near the surface of the diamond crystal, decreasing with smaller radii to a local minimum at least about 5 micrometers below the surface of the crystal. (In other words, the local maximum and local minimum could be very close together). The impurity concentration within the outermost 3–50 micrometers is about 10 to about 10,000 parts per million. (Taken literally, the "outermost" surface region of the crystal would be measured from the actual crystal surface in a radial direction into the crystal. However, for the present disclosure, the region up to about 3 micrometers into the crystal is not taken into account for the purpose of measuring dopant-element concentration, since that region is affected by the phenomenon of "catalyst imprints", as described below).

Also, this invention includes a 3-D diamond crystal in which one component (i.e., the tangential component) of the stress state of some of the facet surfaces of the crystal is compressive in the range of about 10 to about 5000 megapascals (MPa). The tangential compressive surface stresses are up to and including about 5000 MPa. The radial surface stress is always 0 MPa. Also, the compressive tangential stresses on the diamond crystal of this invention can be superimposed on existing tensile tangential stresses on the crystal. The range of superimposed compressive tangential stresses on preexisting tensile tangential stresses in the diamond crystal is about 10 to about 5000 MPa.

Herein, the invention will be demonstrated by using boron, nitrogen and hydrogen. Because of the extremely high binding energy and atomic density of diamond, only boron, nitrogen and hydrogen can dissolve to an appreciable extent in diamond. Even in the cases of boron, nitrogen and hydrogen, the solubility is limited, and amounts to less than a few hundred parts per million for nitrogen and hydrogen, and to less than 1% for boron. Despite their limited solubilities in diamond, dissolved nitrogen, boron or hydrogen can generate stresses because of the large lattice dilations that they cause. If the distribution of nitrogen, boron or hydrogen is not uniform, inhomogeneous strains will occur in the diamond. These uneven strains will generate large long-range stresses. An approximate estimate of the magnitude of these stresses can be found by multiplying the Young's modulus of diamond ($10^{12}$ Pascals) by the strain generated by an impurity. For nitrogen in diamond, the maximum strain occurs at the maximum solubility of nitrogen in diamond, and is of the order of about $4.5 \times 10^{-4}$. This amount of strain will result in a stress of the magnitude of about $5 \times 10^8$ Pascals. This compares with experimental diamond crushing strengths of about $0.2 \times 10^{10}$ to about $2 \times 10^{10}$ Pascals. Thus, stresses generated by non-uniform distributions of nitrogen in diamond can be as high as about 2.5% to about 25% of the crushing strength of diamond.

Uneven distribution of nitrogen or boron in diamonds can arise from two different sources. The first source of an inhomogeneous distribution of boron or nitrogen is the variation of the distribution coefficient (the ratio between the solubility of an impurity in the liquid and the solid phase) of boron and nitrogen with the diamond crystal growth facet. For example, nitrogen incorporation typically is greater in the (111) growth sector, slightly less in the (100) growth sector, and still less in the (113) and (110) sectors. The nitrogen concentration is commonly as high as several hundred parts per million. If a section is made through the center of a typical synthetic diamond crystal, the cross-section will typically exhibit both (111) and (100) growth sectors. The greater lattice expansion caused by nitrogen in the (111) growth sectors is incompatible with the lower lattice expansion in the low nitrogen (100) sector. These incompatible strains generate tensile stresses in the (100) growth sector, and compressive stresses in the (111) growth sector. The tensile stresses in the (100) sector may weaken the diamond crystal in mechanical grinding and sawing applications.

Boron also has a distribution coefficient that is dependent on the crystal growth facet of diamond. For the higher concentrations of boron that are of interest, boron is preferentially incorporated in the (111) sector in both gem diamonds and CVD diamond. Boron causes the diamond lattice to expand by 33.7%, and its solubility in diamond can be as much as 0.9%. Thus, the incorporation of boron will also lead to stresses in a diamond crystal in a manner similar to that of nitrogen. For boron in diamond, the maximum strain occurs at the maximum solubility of boron in diamond, and is of the order of $3 \times 10^{-3}$. This amount of strain can result in a stress of the magnitude of $3.4 \times 10^9$ Pascals, which is significant in comparison to the experimental diamond crushing strengths of about $0.2 \times 10^{10}$ Pascals to about $2 \times 10^{10}$ Pascals. Thus, stresses generated by non-uniform distributions of boron in diamond can be as high as about 17% to 170% of the crushing strength of diamond.

A second source of an inhomogeneous distribution of boron or nitrogen in a diamond crystal arises from changes in the growth-cell conditions occurring during crystal growth. Temporal changes in the pressure, the temperature, the concentration of impurity in the melt and/or the crystal growth rate can change the amount of boron or nitrogen incorporated in the crystal as a function of time. Inhomogeneities arising from such causes will lead to radial impurity concentration gradients in the crystal. The presence of stresses resulting from such radial concentration gradients suggests possible ways to toughen a diamond crystal by suitable changes in the growth-cell conditions during crystal growth.

To achieve an analytic solution, approximate the faceted soccer-ball shape of an equiaxed diamond crystal by a diamond sphere. This is actually a reasonably good approximation to the highest quality diamond grit whose shape approaches that of a sphere. In addition, consider in detail only the case where the impurity concentration gradients are solely a function of the radial distance R from the center of the diamond crystal.

The mechanical equilibrium of any small spherical element demands a balance between the differential radial forces on the opposing faces of the element. If $\phi$ is the angle subtended in both tangential directions by the spherical element; $\sigma_r$ is the radial stress, $\sigma_t$ is the tangential stress, and R is the radius of the spherical element, then a balance of radial force requires:

$$[(R+dR)d\phi]^2[\sigma_r+(d\sigma r/dR)dR]-(Rd\phi)^2\sigma r=2[Rd\ \phi dR]\sigma_t d\phi \tag{1}$$

which reduces to equation 2 as dR and $d\phi$ approach zero.

$$d\sigma_r/dR+2(\sigma_r-\sigma_t)/R=0 \tag{2}$$

Strains in the diamond are caused by stresses, and by the presence of impurities that cause expansion or contraction of the diamond lattice. The strain $\epsilon_i$ caused by an impurity is given by:

$$\epsilon_i=\alpha C, \tag{3}$$

where $\alpha$ is a constant dependent on the impurity, and C is the atomic concentration of the impurity in the lattice. For nitrogen, boron and hydrogen in diamond, $\alpha$=0.4, 0.337 and 0.31, respectively.

The stresses developed in the diamond are related to the strains by Hooke's Law:

$$\sigma_r-2\nu\sigma_t=E(\epsilon_r-\epsilon_i) \tag{4a}$$

$$\sigma_t-\nu(\sigma_t+\sigma_r)=E(\epsilon_t-\epsilon_i) \tag{4b}$$

where $\nu$ is Poisson's ratio, E is Young's modulus for diamond, $\epsilon_r$ is the radial strain, and $\epsilon_t$ is the tangential strain. The impurity strain $\epsilon_i$ in equations 4a and 4b is subtracted from the elastic strains $\epsilon_r$ and $\epsilon_t$, respectively, because the impurity strain is not supported by elastic stresses, but instead is generated by changes in the lattice size caused by an over- or under-sized impurity atom. The commonly-accepted value of Poisson's ratio for the diamond is 0.07. The orientation-averaged Young's modulus for diamond is $1.143 \times 10^{12}$ N/m².

Equations 4a and 4b can be solved for the radial stress $\sigma_r$ and tangential stress $\sigma_t$:

$$\sigma_r=E/[(1+\nu)(1-2\nu)][(1-\nu)\epsilon_r+2\nu\epsilon_t-(1+\nu)\ \alpha C] \tag{5a}$$

$$\sigma_t=E/[(1+\nu)(1-2\nu)][\nu\epsilon_r+\epsilon_t-(1+\nu)\alpha C] \tag{5b}$$

The radial $\epsilon_r$ and tangential strains $\epsilon_t$ can be expressed in terms of the radial displacement u.

$$\epsilon_r=du/dR \tag{6a}$$

$$\epsilon_t=u/R \tag{6b}$$

Equations 6a and 6b are substituted into Equations 5a and 5b, and then into Equation 2, to give:

$$d^2u/dR^2 + 2/R\, du/dR - 2u/R^2 = (1+v)/(1-v)\alpha\, dC/dR \quad (7a)$$

or $$d/dR[1/R^2 d/dR(R^2 u)] = (1+v)/(1-v)\alpha\, dC/dR, \quad (7b)$$

which is Laplace's Equation in spherical coordinates. Integration of Equation 7b gives the displacement u(R):

$$u(R) = (1+v)/(1-v)\alpha 1/R^2 \int C(r) r^2\, dr + A\, R + B/R^2 \quad (8)$$

where A and B are constants of integration, and C(r) is the concentration of nitrogen or boron in the diamond, as a function of the radius. For a solid sphere of diamond by symmetry, the displacement u→0, as R→0, so that B=0. Equation 8 can be substituted back into Equations 6a, 6b, 5a and 5b to find the radial and tangential stresses in the diamond:

$$\sigma_r(R) = -(2\alpha E)/(1-v) 1/R^3 \int C(r) r^2\, dr + EA/(1-2v) \quad (9a)$$

$$\sigma_t(R) = \backslash F(\alpha E, (1-v))\backslash F(1,R^3) \int C(r) r^2\, dr\, EA/(1-2v) - \alpha E\, C(R)/(1-v) \quad (9b)$$

The radial stress $\alpha_r$ at the outer free surface ($\alpha_r=0$ at R=S) of the diamond must be zero ($\alpha_r=0$ at R=S), so from Equation 9a, the constant A is found to be:

$$A = [2\alpha(1-2v)/(1-v)](1/S^3)\int C(r) r^2 dr, \quad (10)$$

where S is the radius of the diamond. Introduction of the constant A in equations 9a and 9b yields:

$$\sigma_r(R) = (2\alpha E)/(1-v)[1/S^3 \int C(r) r^2\, dr - 1/R^3 \int C(r) r^2 dr] \quad (10a)$$

and $$\sigma_t(R) = (\alpha E)/(1-v)[2/S^3 \int C(r) r^2 dr + 1/R^3 \int C(r) r^2 dr - C(R)] \quad (10b)$$

Equation 10a has an interesting physical interpretation. The radial stress is proportional to the difference between the average impurity concentration in the entire diamond (the first integral of Equation 10a) and the average impurity concentration in the diamond within the radius R of interest (the second integral of Equation 10a). If the average concentration within a radius of R is greater than the average impurity concentration for the entire diamond, the radial stress will be compressive for an impurity that expands the lattice.

The three cases demonstrated are: a radially increasing concentration of impurity; a radially decreasing concentration of impurity; and a thin impurity-rich layer or "shell". These different impurity distributions will generate different stress states in the diamond crystal, and may strengthen the crystal.

The following discussion is related to the stresses that develop in a diamond crystal with particular radial distributions of impurities.

The first case of interest is where the concentration of impurity increases linearly with the radius, i.e., C(r)=C$_o$r/S from r=0 to r=S. Substitution into Equations 10a and 10b yields:

$$\sigma_r(R) = \alpha E C_o/2(1-v)[1-R/S] \quad (11a)$$

$$\sigma_t(R) = \alpha E C_o/4(1-v)[1-3R/S] \quad (11b)$$

The following is the case where α is positive, that is, the impurity causes an expansion of the diamond lattice. The radial stress is tensile, i.e., positive, and a maximum at the center of the diamond, and decreases linearly to zero at the surface of the diamond. The tangential stresses are also a maximum at the center of the diamond, and are also tensile there. However, at a radius equal to ⅔ the radius of the diamond, the tangential stresses pass through zero and thereafter become compressive stresses, i.e., negative, and reach a maximum compression state at the surface of the diamond. These tangential compressive stresses at the surface of the diamond will make the diamond less likely to fail in tension and fracture, and therefore toughen the diamond crystal.

The case where the impurity causes a contraction of the diamond lattice (α<0) just reverses the signs of the stresses, so that the radial stress is compressive, and is at an absolute maximum at the center, and decreases linearly to zero from the center to the surface of the diamond. The tangential stresses are also compressive and at an absolute maximum at the center of the crystal. At a radius of ⅔ the radius of the diamond, the tangential stresses change from compressive to tensile, and reach a maximum at the surface of the diamond. These tangential tensile stresses at the surface of the diamond may weaken the diamond by making it more susceptible to tensile failure and fracture from minor scratches.

Shear stresses can also cause a diamond to fail, particularly at higher temperatures, where the shear yield strength rapidly decreases with increasing temperature. The maximum shear stress $\alpha_s$ in a diamond with a radial-type of concentration gradient is given by one-half the difference between the radial stress $\alpha_r$ and the tangential stress $\alpha_t$:

$$\sigma_s(R) = \frac{1}{2}[\sigma_r(R) - \sigma_t(R)] = [\alpha E C_o/8(1-v)] R/S \quad (12)$$

Figure 3:
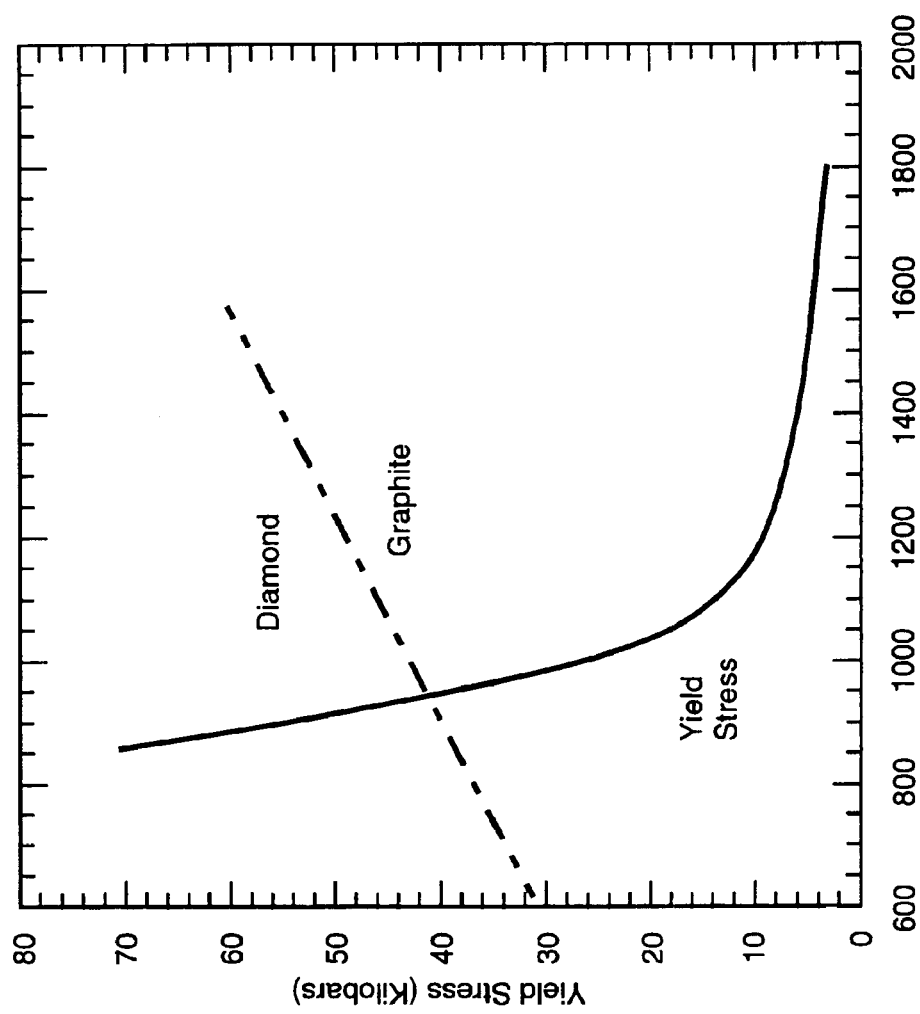
FIG. 3 also represents the prior art, depicting the plastic yield stress (solid line) of diamond, versus temperature. The diamond-graphite equilibrium line (dashed line) is also shown.

It should be noted that the shear stress increases with the radius, and reaches a maximum at the surface of the diamond. Diamond will fail when the shear stress exceeds the shear yield stress K of diamond, as shown in FIG. 3, which is dependent on the crystallographic direction, crystallographic plane, and temperature.

Figure 5:
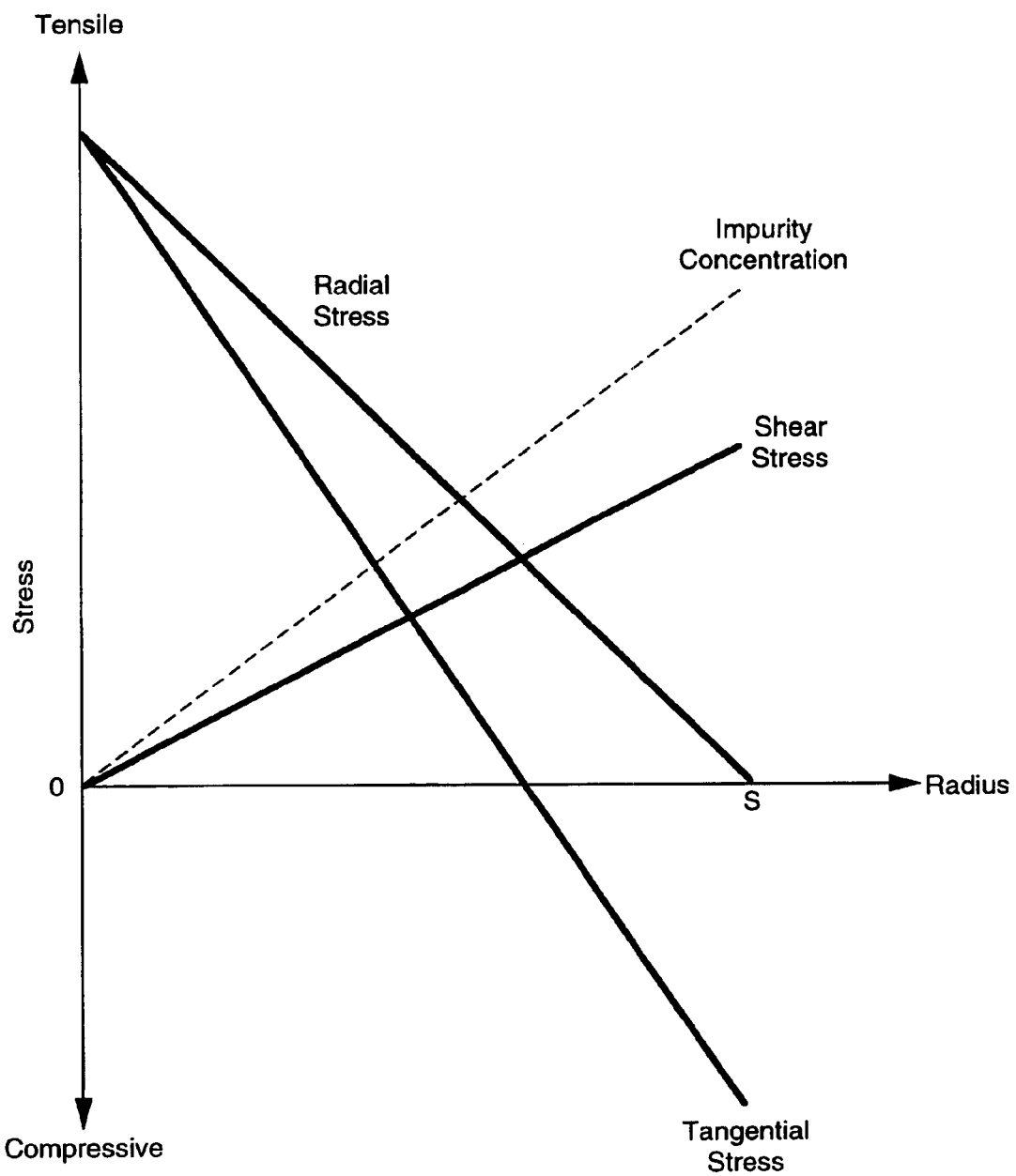
FIG. 5 demonstrates this invention, depicting the radial, tangential and shear stresses in a diamond with a positive, linear radial gradient of impurities.

The concentration of impurities and the radial, tensile and shear stresses are plotted as a function of the radius in FIG. 5, for the case where an impurity like boron or nitrogen expands the diamond lattice.

A second case of interest (demonstrating the prior art) is where the concentration of impurity decreases linearly with the radius, i.e., C(r)=C$_o$(1−r/S) from r=0 to r=S. Substitution into Equations 10a and 10b yields:

$$\sigma_r(R) = -\alpha E C_o/2(1-v)[1-R/S] \quad (13a)$$

$$\sigma_t(R) = -\alpha E C_o/4(1-v)[2-3R/S] \quad (13b)$$

The absolute value of the stresses remains unchanged, and only their signs are changed from the previous case. Since the first term in the concentration expression, C(r)=C$_o$(1−r/S), namely C$_o$, represents a uniform concentration term, it does not cause any stresses. The expression —C$_o$(r/S) then remains, which is the same concentration distribution that was used in the previous case, except for its sign.

In the usual case for diamond, where α is positive, the impurity causes an expansion of the diamond lattice. The radial stress is compressive, i.e., negative, and a maximum at the center of the diamond, and decreases linearly to zero from the center of the diamond to the surface of the diamond. The tangential stresses are also a maximum at the center of the diamond, and are compressive there. However, at a radius equal to ⅔ the radius of the diamond, the tangential stresses pass through zero and thereafter become tensile stresses, i.e., positive, and reach an absolute maximum at the surface of the diamond. These tangential tensile stresses at the surface of the diamond will make the diamond more likely to fail in tension and weaken the diamond crystal by making it more susceptible to fracture.

The case where the impurity causes a contraction of the diamond lattice ($\alpha<0$) just reverses the signs of the stresses so that the radial stress is tensile and at an absolute maximum at the center, and decreases linearly to zero from the center to the surface of the diamond. The tangential stresses are also tensile and at an absolute maximum at the center of the crystal. At a radius of $\frac{2}{3}$ the radius of the diamond, the tangential stresses change from tensile to compressive, and reach a maximum at the surface of the diamond. These tangential compressive stresses at the surface of the diamond may strengthen the diamond by making it more resistant to tensile failure and fracture caused by surface flaws or scratches.

Figure 4:
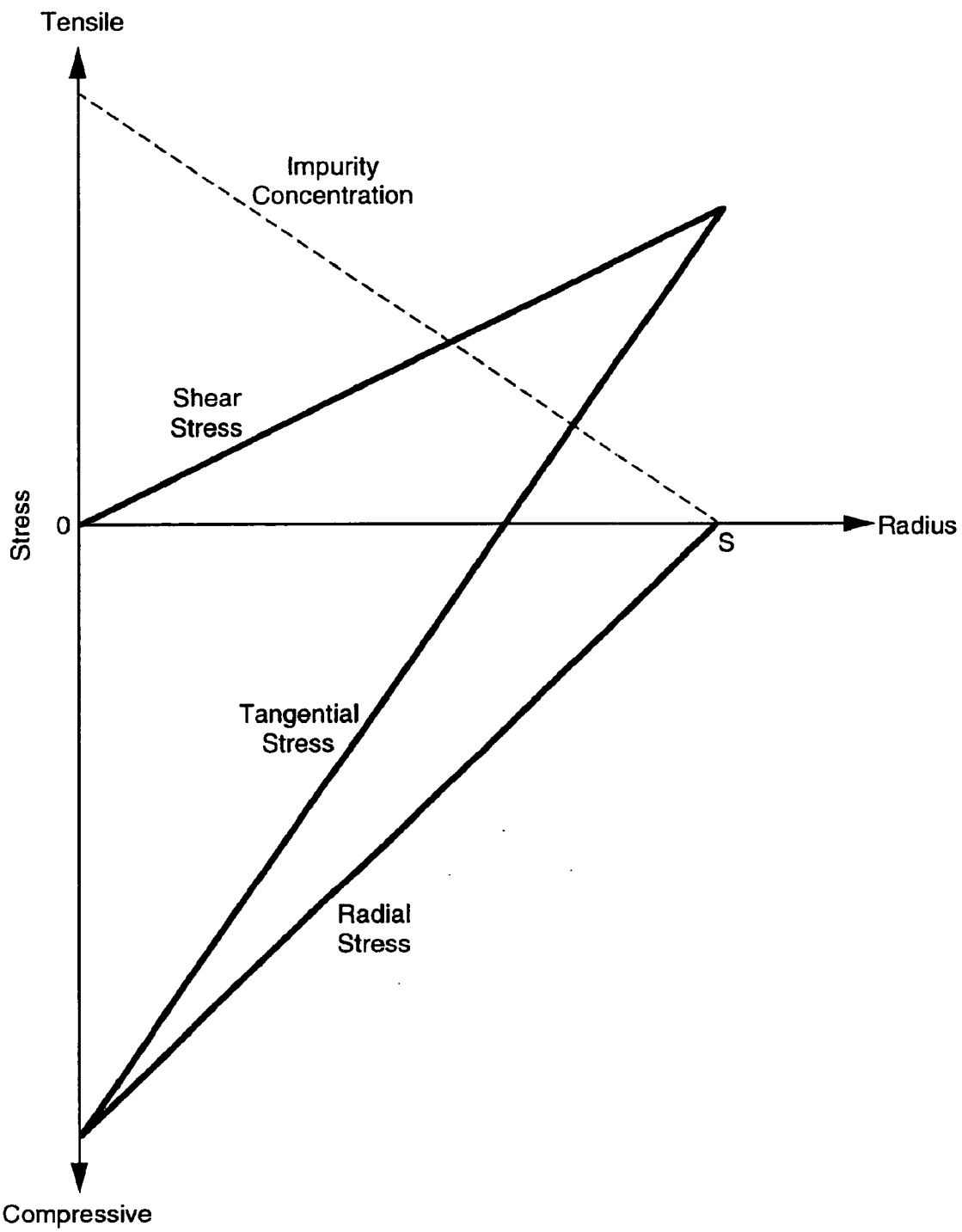
FIG. 4 also represents the prior art, depicting the radial, tangential, and shear stresses in a diamond with a negative, linear radial gradient of impurities.

Because only the sign of the radial and tangential stresses was reversed by inverting the impurity expansion to impurity contraction, the shear stresses which are derived from the difference in the radial and tangential stresses remain the same as in the previous case. For the radially decreasing concentration gradient case, the concentration of impurities and the radial, tensile and shear stresses are plotted as a function of the radius in FIG. 4 (prior art), for the case where an impurity like boron or nitrogen expands the diamond lattice.

A third case of interest is where the impurity resides in a thin shell of thickness "x" adjacent to the external surface of the diamond. Such a case could arise if the diamonds were exposed to boron, nitrogen, or hydrogen during the final stage of growth, so that the boron, nitrogen, or hydrogen becomes incorporated within a thin outer shell of the diamond crystal.

Similarly, if the diamonds were exposed to a high energy plasma containing hydrogen, nitrogen, or boron, these impurities could become implanted in a thin shell contiguous to the outer surface of the diamond.

This distribution of impurities would be described mathematically as follows: for $0<R<(S-x)$, $C=0$; for $(S-x)<R<S$, $C=C_o$, where x is the thickness of the shell. Substitution into Equations 10a and 10b yields for the condition of a thin shell, i.e., $x<<S$:

$$\sigma_r(R)=2\alpha E C_o/(1-\nu)[x/S]\cdot R<(S-x);\ x<<S \tag{14a}$$

$$\sigma_r(S)=0\cdot R=S; \tag{14b}$$

$$\sigma_t(R)=2\alpha E C_o/(1-\nu)[x/S]\cdot R<(S-x);\ x<<S \tag{14c}$$

$$\sigma_t(S)=-\alpha E C_o/(1-\nu)[1-3x/S]\cdot R=S;\ x<<S \tag{14d}$$

Figure 6:
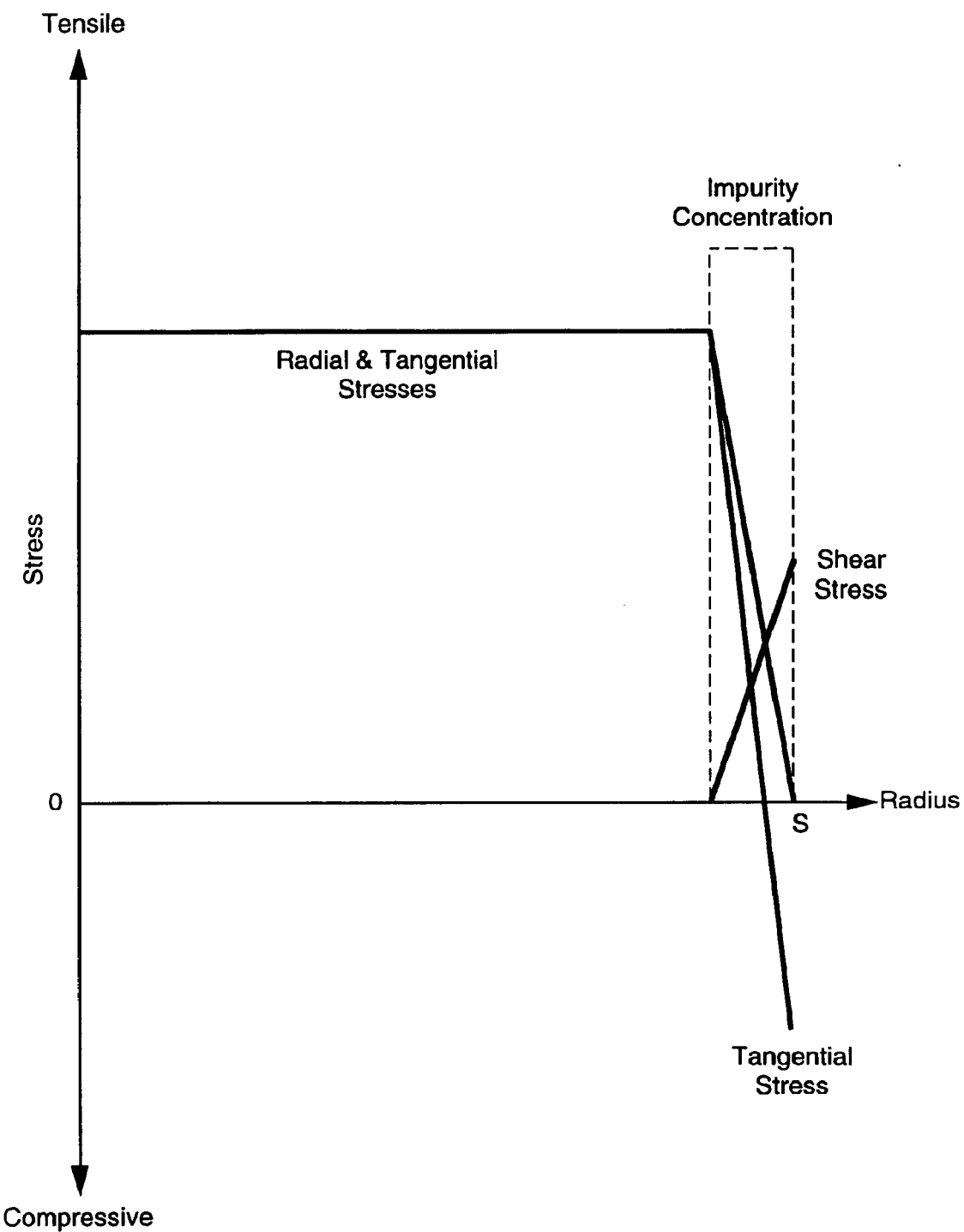
FIG. 6 also demonstrates this invention, depicting the radial, tangential and shear stresses in a diamond with a thin, impurity-rich shell contiguous to the outer surface of the diamond.

In the case where $\alpha$ is positive, that is, the impurity causes an expansion of the diamond lattice, the radial stress is a small constant tensile stress in the zone inside the diamond which is free of impurities. The radial stress rapidly decreases as the outer shell of impurities is crossed, and falls to zero on the surface of the diamond, as expected. The tensile stresses are also small tensile stresses in the impurity-free zone inside the diamond. However, the tangential stresses change to large compressive stresses on the surface of the diamond. This compressive stress state on the diamond surface will make the diamond more resistant to tensile failure and fracture, and will thereby toughen and strengthen the diamond. FIG. 6 shows the impurity concentration profile and stress distribution for a diamond crystal with a thin shell of impurities at its outer surface.

In the limit of a thin coating ($x<<S$), $$\sigma_t(S)\approx-(\alpha E C_o)/(1-\nu) \tag{14d'}$$

It can easily be shown that this is a general result for diamond crystals with a thin, impurity-rich shell, e.g., where the impurity concentration decreases from $C_o$ at the surface, linearly or exponentially with depth below the surface. The physical reason for this is clear: the underlying crystal forces the thin shell to adapt the same lattice constant in the tangential direction, generating a compressive tangential stress, because the element-doped thin shell would otherwise adopt a larger lattice constant.

The case where the impurity causes a contraction of the diamond lattice ($\alpha<0$) just reverses the signs of the stresses. The case where a diamond containing a uniform level of impurity has a thin shell depleted of impurities contiguous to the external surface would have the same absolute stress values as Equations 14a–14d, but the signs of all the stresses would be reversed.

The shear stresses $\alpha_s$ generated by a thin shell of impurities are given by the difference between the radial stress and the tangential stresses in the diamond:

$$\sigma_s(R)=0\cdot R<(S-x);\ x<<S \tag{15a}$$

$$\sigma_s(S)=|\alpha|E C_o/2(1-\nu)[1-3x/S]\cdot R=S;\ x<<S \tag{15b}$$

The shear stresses are zero inside the impurity-free region where a state of pure hydrostatic tension exists. On passing through the thin spherical shell of impurities, the shear stresses rise to a maximum at the surface of the diamond.

Equations 14 and 15 (i.e., the various equations under those designations) demonstrate that the tangential stress at the surface of the crystal approaches a limiting value as the element-doped shell becomes infinitesimally thin. However, there is a practical limit on the thickness of the shell, if it is to generate substantial stresses. The facets of diamond crystals grown at high pressure and high temperature are not perfectly smooth. Instead, they are covered by shallow, vein-like structures, which are often referred to as "catalyst imprints". These structures are produced at the end of the growth cycle during cooling, due to precipitation of carbon from the catalyst/solvent as it freezes onto the surface of the diamond crystals. These vein-like features are normally a few micrometers in height (usually less than about 3 micrometers). For a thin, impurity-containing shell to generate substantial tangential stresses at the surface of the crystal, it must contiguously cover the entire crystal, regardless of the presence of the catalyst imprint, and therefore must be thicker than about 3 micrometers.

The rate of linear crystal growth normally decreases during the course of growth, and impurities in the growth medium normally become incorporated into the diamond throughout the run. In one method of this invention, using the High Pressure High Temperature (HPHT) process to make diamond crystals, a powdered boron source, such as boron carbide ($B_4C$) boron nitride (BN), or elemental boron, is encapsulated by carbon and added to the growth cell. Encapsulation of the boron source powder is achieved by CVD through methane pyrolysis; coating with colloidal graphite and drying; sputtering; or the like. During the early stages of diamond growth at HPHT, no boron is available to growing diamond crystals. As growth proceeds, the carbon coating dissolves into the metal solvent-catalyst, eventually exposing the boron source. At this point, boron begins dissolving in the solvent-catalyst, and becomes incorporated into the outer portion of the diamond crystals. The boron level and the thickness of the boron-doped layer can be controlled by varying the concentration and size of the boron-containing particles within the growth medium, and the thickness of the carbon coat.

Another method is using a carbon-encapsulated nitrogen source, such as $Fe_xN$, to produce crystals with a positive nitrogen radial concentration gradient. If desired, the nitrogen level in the center portion of the crystals can be reduced by means of a getter in the growth medium, a low-porosity cell, or by excluding air from the growth cell immediately prior to growth.

Another method is to reduce the growth temperature for the crystals by at least about 10° C. near the end of the HPHT cycle. At least about 5 micrometers of diamond is then grown at the reduced temperature, followed by quenching. Impurity incorporation decreases with increasing growth temperature. Therefore, the reduced, final growth temperature will generate a higher impurity concentration near the surface of the crystal.

Another alternative method of the invention involves deposition of a boron or nitrogen-rich layer on lightly- or undoped diamond crystals grown normally. This could be performed by using the undoped crystals as seeds in a second HPHT run, where sufficient boron, nitrogen, or boron and nitrogen is present in the growth medium to produce a doped, epitaxial layer over the crystal. This option requires a second growth run. However, since only a thin shell (about 3 to about 50 micrometers thick) is needed, the number of diamond crystals in the cell could be larger than normal.

Still another method of the invention involves diffusing impurities into the diamond crystals by means of exposure to a plasma which contains hydrogen, nitrogen, or boron, or some mixture of any of those gasses. Plasma equipment is well-known in the art.

In an alternative method, the undoped or lightly-doped crystals could be placed in a CVD (chemical vapor deposition) reactor, and a doped, epitaxial layer grown by adding a boron or nitrogen-containing gas to the normal reactant feedstock—typically hydrogen, methane and oxygen. Deposition at a substrate temperature less than or approximately equal to 740° C. would add additional intrinsic compressive stress to the doped diamond layer, and could perform the purpose of this invention, even in the absence of doping. The film of doped diamond is about 3 to about 50 micrometers thick, and the concentration of the doped impurity in the outer layer is greater by about 40 to about 10,000 parts per million than the concentration of the impurities in the outermost portion of the underlying diamond crystal.

One way that crystal growth conditions can generate stresses in a diamond crystal is the case where the pressure and temperature in the cell vary with time. If controlled in a suitable manner, such varying conditions can produce positive radial impurity concentration gradients in the diamond crystal. For impurities such as boron, nitrogen or hydrogen that expand the diamond lattice, positive radial gradients will produce a compressive stress state at the surface of the diamond that will toughen the diamond and make it more resistant to tensile fracture. Also, by increasing the growth rate of the diamond crystal as a function of the radius (time), there will be an increase in the incorporation of the concentration of impurities in the diamond. Furthermore, by increasing the concentration of impurities in the melt with time, there will be an increasing impurity concentration-versus-radius.

Yet another method to achieve the diamond crystal with increased CFS of this invention is to produce swelling near the outer surface of the diamond crystals grown by the High Pressure High Temperature process (HPHT). This can be done by radiation damage by means of ion or electron bombardment. The radiation damage causes swelling of the diamond lattice because of interstitials and vacancies, where the interstitial atoms could be either carbon atoms or impurity atoms, or a combination thereof. This thin shell of lattice-expanding impurities will generate a compressive stress state at the surface of the diamond crystal, and make it more resistant to fracture. In contrast to the strengthening provided by radial gradients, the protection from this thin compression shell disappears once the thin shell is penetrated by abrasion of the crystal during use. A 3-D diamond crystal having a surface which has been ion-implanted or subjected to radiation damage may have an impurity atom, interstitial, and vacancy concentration in the range of about 1–10,000 parts per million.

Other methods for doping impurities in the outermost surface of the diamond crystal include impurities deposited in a layer by hydrothermal growth, electrochemical growth, liquid phase solid source growth, or molten salt growth.

Table 1 demonstrates the invention and the impact of impurity concentrations of nitrogen, boron and hydrogen on the compressive fracture strength (CFS) for a diamond crystal at its outer surface.

TABLE 1

Strength Increase for Diamond Crystal With Inhomogeneous Concentration of Impurities (Dopant Elements) Near the Surface

| Impurity | Maximum Conc. (ppm) | Maximum Tangential Stress (Graded) (MPa) | Maximum Tangential Stress (Thin Layer) (MPa) | Increase in Strength (Graded) | (Thin) |
|---|---|---|---|---|---|
| Nitrogen | 1,000 | 123 | 492 | 7.7% | 30.8% |
| Boron | 10,000 | 1040 | 4150 | 65.0% | 259% |
| Hydrogen | 1,000 | 95 | 381 | 5.9% | 23.8% |

Strength of 40/45 diamond crystal = 1.6 Gigapascals ($10^9$ Pascals)
$E_0 = 1.143 \times 10^{12}$ Pascals
$\alpha_N = 0.4$
$\alpha_B = 0.337$
$\alpha_H = 0.31$
$v = 0.07$; $1-v = 0.93$
$E_0/(1-v) = 1.23 \times 10^{12}$ Pascals
$E_0/4(1-v) = 3.07 \times 10^{12}$ Pascals

EXAMPLES

The following examples further serve to illustrate the invention.

Example 1

The starting material was a sample of high-grade diamond crystals obtained from General Electric Company (GE Superabrasives). The crystals had a 40/45 mesh size, and were grown according to the HPHT process, which is known to those skilled in the art. The nitrogen distribution in the untreated crystals showed a tensile tangential stress at the surface of approximately 50 MPa, weakening the crystals. The compressive fracture strength (CFS) of the untreated crystal was measured by roll-crusher apparatus as 63.5 lbs.

The nitrogen (N) concentration was measured as 4.2 ppm on the (100) crystal facet by Secondary Ion Mass Spectrometry (SIMS) (not an absolute value). The nitrogen (N) concentration was measured as 29.5 ppm on the (111) crystal facet by SIMS (also not an absolute value). The SIMS signals were converted to concentrations by using ion-implanted diamond standards. However, ion implantation causes lattice damage, and likely affects the sensitivity.

Comparison of the SIMS data with nitrogen concentrations determined by combustion analysis (LECO) of whole crystals indicates that the SIMS-determined concentrations are too low by a factor of 2–4.

The diamond crystals were then placed on a substrate inside a microwave plasma chemical vapor deposition (CVD) reactor. The flow rate was 1000 sccm hydrogen ($H_2$), 5 sccm methane, and 10 sccm nitrogen ($N_2$). The pressure was about 70 torr; the substrate temperature was between about 700–750° C., and the microwave power was about 3 Kilowatts. The diamond crystals were coated with nitrogen-doped CVD diamond for 3 hours. The coating growth was interrupted to roll the crystals around, and then the coating deposition was repeated for another 3 hours to achieve a uniform coating.

The thickness of the nitrogen-doped CVD diamond shell was about 5 micrometers. The compressive fracture strength (CFS) of the coated crystals was measured by a roll-crusher apparatus at 65.9 lbs—an increase of 3.8%. The nitrogen concentration in the diamond layer on the (100) face of the coated crystals was measured by SIMS as 62.5 ppm (not an absolute value). The nitrogen (N) concentration on the (111) face of the coated crystals was measured by SIMS as 79.5 ppm.

Using the average surface concentrations measured by SIMS, the theoretical model of the present invention predicts that the coating generated a compressive tangential stress of 26.6 MPa, resulting in an increase in fracture strength of 1.7%. However, scaling the SIMS-determined surface nitrogen concentrations by a factor of 2–4, as mentioned above, would predict a strength increase of 3.4–6.8%, in excellent agreement with the measured value of 3.8%.

Figure 7:
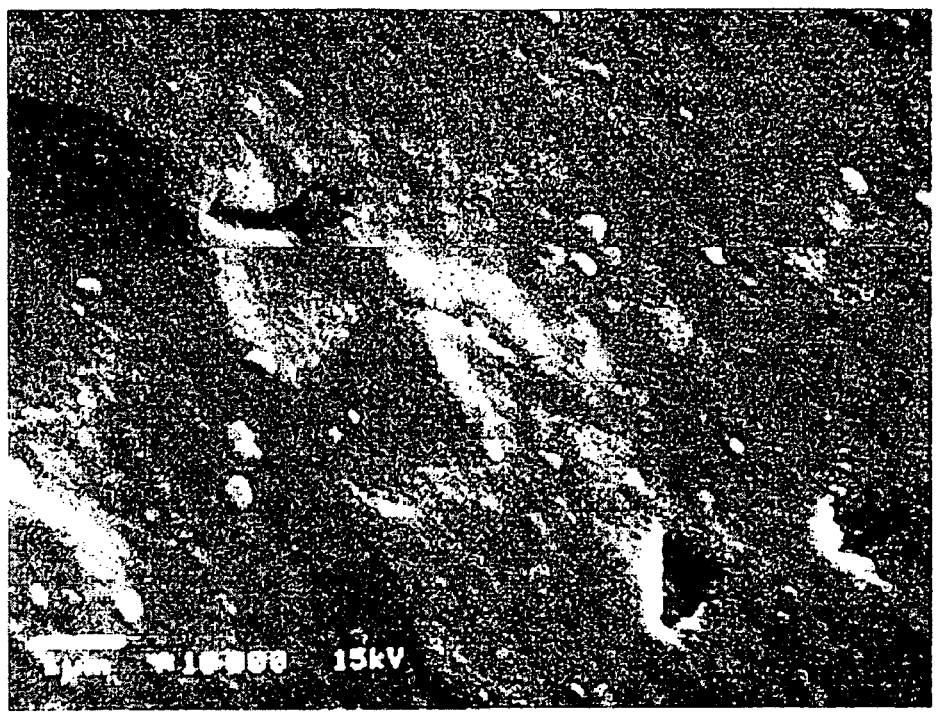
FIG. 7 is a photomicrograph of a (111) crystal facet on a diamond crystal of this invention, having a thin, impurity-rich shell on the surface of the diamond.
Figure 8:
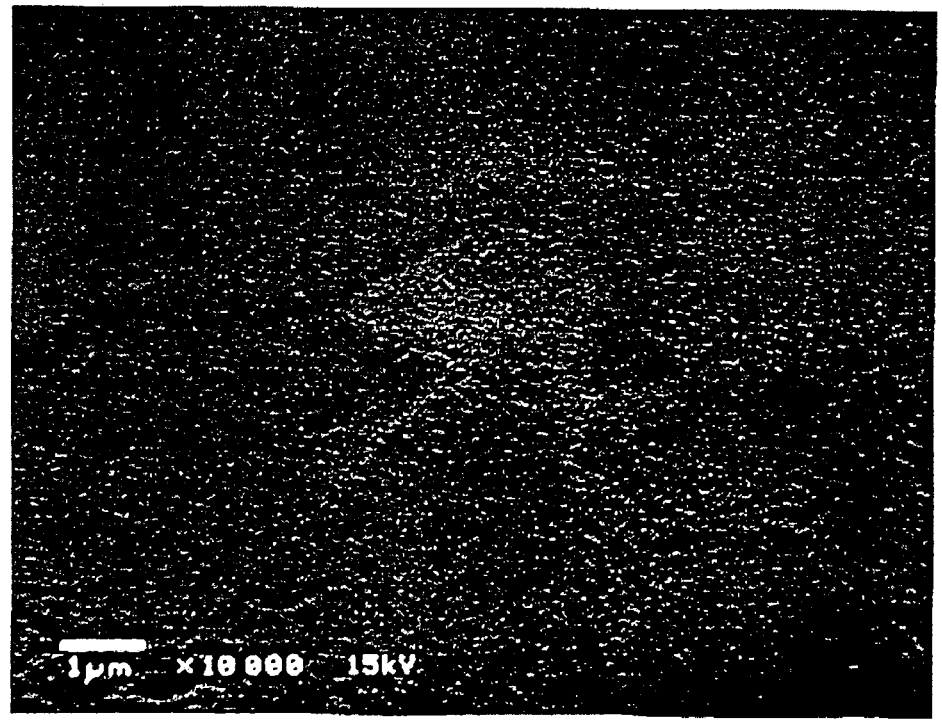
FIG. 8 is a photomicrograph of a (100) crystal facet on a diamond crystal of this invention, having a thin, impurity-rich shell on the surface of the diamond.
Figure 9:
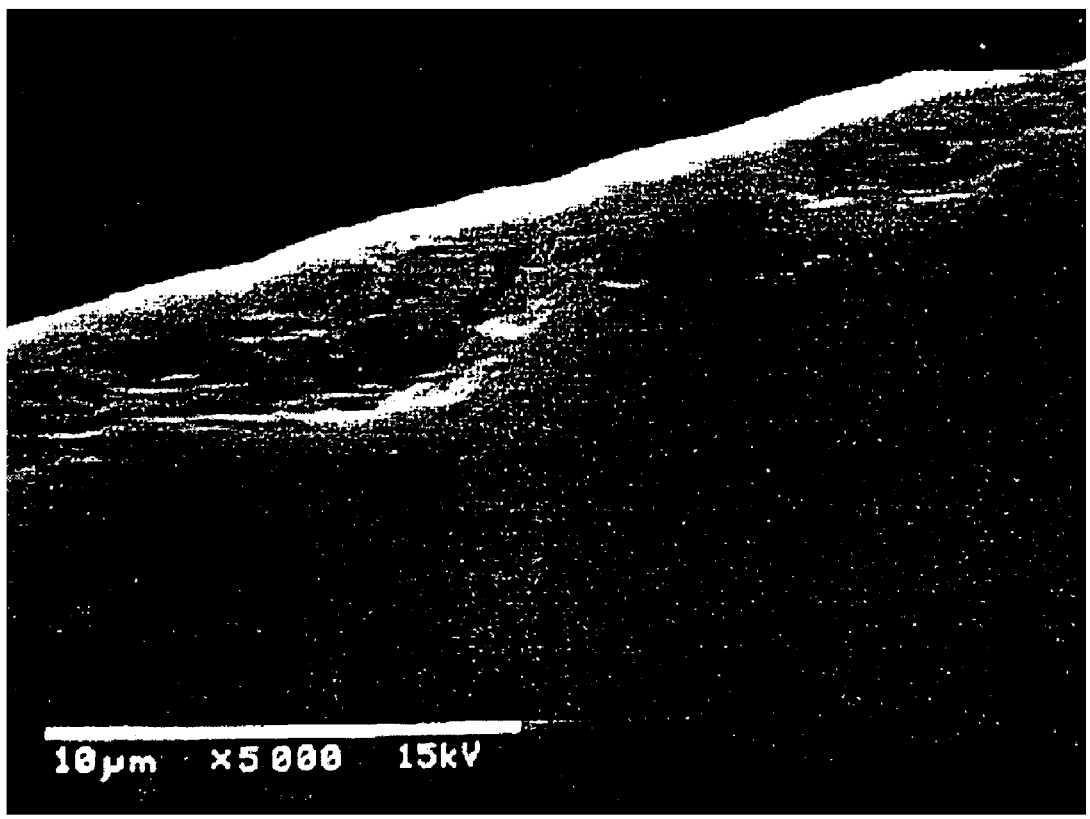
FIG. 9 is a photomicrograph of a cross-section of the coating thickness of the diamond of this invention.

Pock marks, surface roughness (see FIGS. 7 and 8), unevenness of the coated layer (also see FIG. 9) gives somewhat lower strengthening than calculated.

Example 2

The starting material was another sample of high-grade diamond crystals obtained from General Electric Company. The crystals had a 40/45 mesh size, and were grown according to the HPHT process, as in Example 1. The nitrogen distribution in the untreated crystals showed a tensile tangential stress at the surface of approximately 50 MPa, weakening the crystals. The compressive fracture strength (CFS) of the untreated crystals was measured by roll-crusher apparatus at 70.6 lbs.

The diamond crystals were then placed on a substrate inside a microwave plasma chemical vapor deposition (CVD) reactor. The flow rate was 900 sccm hydrogen ($H_2$). The pressure was about 100 torr; the substrate temperature was between about 700–900° C., and the microwave power was about 3 Kilowatts. The diamond crystals were exposed to the hydrogen plasma for 2 hours. The hydrogen plasma process was interrupted to roll the crystals around. The hydrogen plasma process was then repeated two times for 2 additional hours each time, to achieve uniform exposure of the crystals to the hydrogen plasma.

Compressive fracture strength (CFS) of coated crystals was measured by roll-crusher apparatus as 75.7 lbs—an increase of 7.2%.

Based on literature reports of hydrogen incorporation into diamond by means of hydrogen plasma treatments (M. I. Landstrass et al., Appl. Phys. Lett. 55, 975 (1989); T. Maki et al., Jpn. J. Appl. Phys. 31, L1446 (1992); G. Popovici et al., J. Appl. Phys. 77, 5103 (1995)), the surface hydrogen concentration is estimated to be as high as 1000 ppm. The theoretical model of the present invention predicts the surprising result that the indiffused hydrogen atoms will generate a compressive tangential stress as high as 380 MPa, resulting in an increase in fracture strength of 24%. The observed strength-increase is well within this range.

Example 3

A comparison was made between the teachings of U.S. Pat. No. 3,268,457 (Giardini et al) and the teachings of the present invention. "Giardini" discloses a method of creating electrically semiconducting diamonds. The reference was quite dated, and did not provide a description of some of the process conditions which would be helpful in comparing its teachings with those of the present disclosure. However, process conditions (e.g., pressing time) for Giardini which would appear to be most favorable for producing the diamond crystals of the present invention were selected.

Eight samples were used, each containing diamond crystals. Sample A served as a control, and contained only diamond crystals, which were not treated in any way. (The diamond crystals themselves were substantially identical to the diamond crystals used for treatment in Example 1). Sample B served as a second control. It contained a mixture of 0.1 g of diamond crystals and 2.3 g of graphite powder, but did not contain any dopant-impurity. (The graphite serves as a type of pressure medium, which was apparently its function in the Giardini patent). Sample C contained diamond crystals and graphite powder in the same ratio as sample B, but further contained 5% by weight ammonium chloride, based on the weight of diamond and graphite. This sample was designed to follow Example 6 of Giardini, i.e., the use of ammonium chloride as an impurity. Sample D contained diamond crystals and graphite powder in the same ratio as sample B, but also contained 5% by weight boron carbide, based on the weight of diamond and graphite. This sample was designed to follow Example 9 of Giardini, i.e., the use of boron carbide as an impurity. All of the diamond crystals used for samples A–D had a 40/45 mesh particle size. (Particle size was not a significant issue for these experiments. The diamond crystals for the second set of samples (E–H) simply originated from a different batch.).

Samples E, F, G and H were analogous to samples A, B, C and D (respectively), except that these diamond crystals had a 45/50 mesh particle size. Thus, samples E and F were controls. Sample G was treated with ammonium chloride, while sample H was treated with boron carbide.

Using a punch-and-die apparatus, each blend (samples B, C, D, F, G, and H) was pressed (10,000 lb. force) into a pill having a diameter of 0.44 inch, and a height of 0.5 inch. The two pills having the same general composition (i.e., samples B and F; C and G; D and H) were stacked together in a cell formed by two facing cups made of magnesium oxide. The cells were in turn placed inside sleeves fabricated from sodium chloride. The cells were pressed for 20 minutes at a pressure of about 50 killobar, and a temperature of about 1500° C. (based on standard calibration methods). Power to the pressure device was turned off. The samples were then cooled, and the pressure was released. The pills were removed from the cell, and the diamond was separated from the graphite by boiling the material in a mixture of concentrated nitric acid and sulfuric acid.

The compressive fracture strength (CFS) of each sample (including samples A and E) was immediately measured by a roll-crusher apparatus, as described in the examples for the present invention.

TABLE 2

| Sample | | Compressive Fracture Strength | |
|---|---|---|---|
| A*; E* | (Untreated diamond crystals) | 66.2 lbs | 59.7 lbs. |
| B**; F** | (Diamond crystals and graphite) | 70.5 lbs. | 59.9 lbs. |
| C; G | (Diamond crystals and NH$_4$Cl) | 65.0 lbs. | 57.6 lbs. |
| D; H | (Diamond crystals and B$_4$C) | 62.7 lbs. | 60.4 lbs. |

*Control Samples: No impurity; no heat/pressure
**Control Samples: No impurity; but heat/pressure The results in Table 2 show that diamond crystals treated according to the teachings of Giardini showed little, if any, increase in compressive fracture strength. While sample H appeared to show a very small increase (within experimental error), treatment of the diamond crystals with two notable impurity sources (samples C and D: ammonium chloride and boron carbide, respectively) resulted in decreases in CFS values: decreases of 1.9% and 5.3%, respectively, as compared to the untreated diamond crystals of sample A. This is in marked contrast to diamond crystals treated according to the present invention, as described in Examples 1 and 2. In those examples, the CFS values increased considerably when the diamond crystals were treated according to this invention. In the case of doping with nitrogen (Example 1), the increase in CFS was 3.8%. In the case of doping with hydrogen (Example 2), the increase in CFS was 7.2%. A considerable increase in CFS for boron would also be expected, when such a dopant is used to treat diamonds according to the process of the present invention. Moreover, an increase in CFS would also be expected when the dopant was lithium, nickel, cobalt, sodium, potassium, aluminum, phosphorous, oxygen, or mixtures thereof, using this process.

Example 4

The following experiment is also relevant to a comparison of the present invention with the teachings of the Giardini patent discussed in Example 3. In an attempt to diffuse hydrogen into diamond crystals, 0.20 g of high-grade, 40/45 mesh diamond crystals were placed in a boron nitride (BN) cup. 0.14 g of molten paraffin wax was added to the cup and allowed to cool. A BN lid was placed on top of the cup, and the cup was placed in a high-pressure cell and treated at a pressure of approximately 55 kbar and a temperature of approximately 1500° C., for 60 minutes. After cooling and depressurization, the crystals were removed from the cell and isolated by heating in a mixture of concentrated nitric acid and sulfuric acid.

Visually, the crystals appeared the same as before the treatment. The compressive fracture strength (CFS) of the untreated and paraffin-annealed crystals was measured, using the roll-crusher apparatus mentioned above. The annealing treatment reduced the CFS from 54.5 lbs to 45.3 lbs, i.e., a decrease of 17%. While experimental conditions were not equivalent to those described in Example 3 (e.g., graphite was not used here, and the pressure levels were slightly higher), the conditions were sufficiently close to the teachings of the Giardini patent to permit certain observations. First, standard treatments based on prior art knowledge about doping diamond crystals are not generally capable of strengthening the diamonds in the manner taught by the present invention. Second, the lack of strengthening in such crystals is a strong indication that the crystals lack one or more of the required features of diamond crystals of the present invention, e.g., the impurity profile mentioned above and described fully herein.

Moreover, the technology described in the Giardini patent is not sufficient to control the diffusion of impurities into diamond crystals to any desired value. While the Giardini technology may be able to control the diffusion of carriers to some extent, it would not generally be capable of providing the impurity profile claimed in the present invention. Moreover, the Giardini crystals would not be expected to exhibit the tangential compressive stress values which appear to characterize the diamond crystals of the present invention.

Example 5

Some of the diamond crystal samples prepared in Example 3 (i.e., containing ammonium chloride as a source for nitrogen impurities, or containing boron carbide as a source of boron impurities) were subjected to a sputter depth-profile analysis. The analysis was carried out with the SIMS technique, using a Cameca 3F Ion Microscope. (The samples correspond to the sample numbers for Example 3.) In the sputtering technique, cesium was used as the primary ion beam, at a beam energy of 14.5 keV. The raster size was about 100 micrometers, and the detected area was approximately 30 micrometers.

The dimensions in the table refer to depth or distance into the diamond crystal, from the surface. The results are separated for nitrogen content and boron content.

TABLE 3

| Sample* | Mean, 0–2 µm (ppm) | Depth of Local Minimum (µm) | Mean, 3–5 µm (ppm) |
|---|---|---|---|
| Nitrogen | | | |
| A-(100) | 18.5 | 2 | 0.7 |
| B-(100) | 12.7 | — | 11.9 |
| C-(100) | 55.1 | 2 | 2.1 |
| D-(100) | 111.2 | 2.6 | 2.5 |
| A-(111) | 4.2 | — | 4.8 |
| B-(111) | 13.2 | 1.3 | 2.9 |
| C-(111) | 51.2 | 1.0 | 41.2 |
| D-(111) | 15.1 | 0.5 | 11.6 |
| Boron | | | |
| A-(100) | 0.03 | — | 0.03 |
| B-(100) | 0.04 | 0.4 | ** |
| C-(100) | 0.07 | 0.9 | ** |
| D-(100) | 0.03 | — | ** |
| A-(111) | ** | — | ** |
| B-(111) | 0.14 | 0.5 | ** |
| C-(111) | 0.07 | 0.5 | ** |
| D-(111) | 0.42 | 0.6 | ** |

*Sample A was untreated; Sample B was annealed in pure graphite; sample C was annealed in ammonium chloride and graphite; and sample D was annealed in B$_4$C and graphite. (See Example 3)
** Values were lower than the level of detectability of boron concentration.

The data in Table 2 and Table 3 demonstrate clearly that diamond crystals treated according to the Giardini process fail to exhibit the dopant/impurity profile of diamond crystals of the present invention. While some of the Giardini-like samples do display a local minimum for the particular impurity concentration, none of the samples had a local minimum which occurred at a depth of 3 microns or greater.

The Giardini-like crystals also fail to exhibit the increase in strength (e.g., CFS) shown with diamond crystals of the present invention. In the case of doping with nitrogen, the Giardini crystals did not appear to have a maximum impurity concentration at the surface of the crystal, with decreasing concentration toward the center of the crystal. In the case of doping with boron, the Giardini crystals may have exhibited a maximum impurity concentration at the crystal surface, but the concentration of dopant in that region was too small to appreciably strengthen the crystal.

Having described preferred embodiments of the present invention, alternative embodiments may become apparent to those skilled in the art without departing from the spirit of this invention. Accordingly, it is understood that the scope of this invention is to be limited only by the appended claims.

All of the patents, articles, and texts mentioned above are incorporated herein by reference.

What is claimed:

1. A three-dimensional faceted synthetic diamond crystal for use in a tool, the diamond crystal comprising at least one dopant element being selected from the group consisting of boron, aluminum, and combinations thereof, wherein nitrogen is dissolved in the crystal, and wherein the concentration of nitrogen exceeds the total concentration of dopant elements, and having a greater concentration toward or near an outermost surface of the crystal than in the center of the crystal, wherein the concentration of the dopant element is at a local minimum at least about 5 micrometers below the surface,
wherein the concentration of the dopant element causes an expansion of the diamond lattice toward or near the outmost surface of the diamond crystal, the tangential compressive stresses being in the range of between about 10 and about 5000 megapascals (MPa);
and wherein the generation of tangential compressive stresses increases the compressive fracture strength of the diamond as compared to a diamond crystal in which the diamond lattice is not substantially expanded.

2. The diamond crystal of claim 1, wherein the concentration of nitrogen exceeds the total concentration of dopant elements by at least about 5 parts per million.

3. The diamond crystal according to claim 1, wherein the dopant element concentration within an outermost section of about 3 to about 50 micrometers of the crystal is in an amount of about 40 to about 10,000 parts per million.

4. A diamond crystal according to claim 1, wherein the concentration of the dopant element is at a local maximum at a distance less than about 5 micrometers from the surface of the crystal.

5. The diamond crystal of claim 1, wherein the increase in compressive fracture strength is at least about 2%.

6. The diamond crystal of claim 1, wherein the diamond crystal has a diameter of up to about 2 centimeters.

7. The diamond crystal of claim 1, wherein said crystal is a single crystal.

8. The diamond crystal of claim 1, having one or more twin planes.

9. The diamond crystal of claim 1, further comprising a coated film of doped diamond about 3 to about 50 micrometers thick on an outer surface of the diamond crystal, wherein the concentration of the dopant element in the coated film is about 40 to about 10,000 parts per million greater than the concentration of the dopant element in the outer surface of the underlying diamond crystal.

10. The diamond crystal of claim 9, wherein the dopant element is diffused into the diamond crystal, and the concentration at the dopant element is about 40 to about 10,000 parts per million at a depth of about 3 micrometers to about 50 micrometers within said diamond crystal.

11. The diamond crystal of claim 1, wherein the concentration of the dopant element within the diamond lattice increases with increasing radius from the local minimum.

12. A tool comprising a plurality of diamond crystals embedded therein, wherein each of the plurality of diamond crystals has a diamond lattice and comprises at least one dopant element selected from the group consisting of boron, aluminum, and combinations thereof, wherein nitrogen is dissolved in the crystal, and wherein the concentration of nitrogen exceeds the total concentration of dopant elements, and wherein the dopant element is present in a concentration that causes the diamond lattice to expand toward or near an outermost surface of the crystal, thereby generating tangential compressive stresses at the surface of the crystal which increase the compressive fracture strength of the diamond crystal.

13. The tool of claim 12, wherein the tool is a tool selected from the group consisting of grinding wheels, dressing tools for grinding wheels, truing tools for grinding wheels, and saw blades.

14. A tool comprising a plurality of diamond crystals embedded therein, wherein each of the plurality of diamond crystals is a three-dimensional faceted synthetic diamond crystal having a diamond lattice and comprising at least one dopant element, the dopant element being selected from the group consisting of boron, aluminum, and combinations thereof, wherein nitrogen is dissolved in the crystal, and wherein the concentration of nitrogen exceeds the total concentration of dopant element the dopant element being present in a concentration that is greater toward or near an outermost surface of the diamond crystal than in the center of the diamond crystal, the concentration of the dopant element having a local minimum at least about 5 micrometers below the surface, wherein the concentration of the dopant element causes the diamond lattice to expand toward or near the outermost surface, thereby generating tangential compressive stresses in the range of between about 10 to about 5000 megapascals (MPa) at the surface of the crystal which increases the compressive fracture strength of the diamond crystal.

15. The tool of claim 14, wherein the concentration of nitrogen exceeds the total concentration of dopant elements by at least about 5 parts per million.

16. The tool of claim 14, wherein the dopant element concentration within an outermost section of about 3 to about 50 micrometers of the diamond crystal is in an amount of about 40 to about 10,000 parts per million.

17. The tool of claim 14, wherein the concentration of the dopant element is at a local maximum at a distance less than about 5 micrometers from the surface of the diamond crystal.

18. The tool of claim 14, wherein the increase in compressive fracture strength of the diamond crystal is at least about 2%.

19. The tool of claim 14, wherein the concentration of the dopant element within the diamond lattice increases with increasing radius from the local minimum crystal.

20. The tool of claim 14, wherein the diamond crystal has a diameter up to about 2 centimeters.

21. The tool of claim 14, wherein each of the plurality of diamond crystals is a single crystal.

22. The tool of claim 14, wherein each of the plurality of diamond crystals further comprises a coated film of doped diamond disposed on an outer surface of the diamond crystal, the coated film being about 3 to about 50 micrometers thick, wherein the concentration of the dopant element in the coated film is about 40 to about 10,000 parts per million greater than the concentration of the dopant element in the outer surface of the underlying diamond crystal.

23. The tool of claim 22, wherein the dopant element is diffused into the diamond crystal, and the concentration of the dopant element is about 40 to about 10,000 parts per million at a depth of about 3 micrometers to about 50 micrometers within said diamond crystal.

24. The tool of claim 14, wherein the tool is a tool selected from the group consisting of grinding wheels, dressing tools for grinding wheels, truing tools for grinding wheels, and saw blades.

* * * * *